US011421319B2

(12) United States Patent
Soininen et al.

(10) Patent No.: US 11,421,319 B2
(45) Date of Patent: Aug. 23, 2022

(54) PLASMA ETCH-RESISTANT FILM AND A METHOD FOR ITS FABRICATION

(71) Applicant: BENEQ OY, Espoo (FI)

(72) Inventors: Pekka J. Soininen, Espoo (FI); Vasil Vorsa, Coopersburg, PA (US); Mohammad Ameen, Telford, PA (US)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 17/137,205

(22) Filed: Dec. 29, 2020

(65) Prior Publication Data

US 2021/0115555 A1    Apr. 22, 2021

Related U.S. Application Data (62) Division of application No. 16/082,008, filed as application No. PCT/FI2017/050141 on Mar. 3, 2017, now Pat. No. 10,961,620.

(30) Foreign Application Priority Data

Mar. 4, 2016   (FI) ........................ 20165181

(51) Int. Cl.
 *C23C 16/40* (2006.01)
 *C09D 1/00* (2006.01)
 (Continued)

(52) U.S. Cl.
 CPC .............. *C23C 16/40* (2013.01); *C09D 1/00* (2013.01); *C23C 16/45553* (2013.01); *H01J 37/32495* (2013.01); *H01J 2237/332* (2013.01)

(58) Field of Classification Search
 CPC ...... C23C 16/40; C23C 16/45553; C09D 1/00; H01J 37/32495
 (Continued)

(56) References Cited

U.S. PATENT DOCUMENTS 6,858,546 B2    2/2005  Niinisto et al.
2002/0115252 A1*  8/2002  Haukka ............ H01L 21/02178
                                                   438/240
(Continued)

FOREIGN PATENT DOCUMENTS

EP    1676935 A2      7/2006
JP    2003297809 A *  10/2003
(Continued)

OTHER PUBLICATIONS

Machine English translation_JP_2003297809_A; Inagi, K. et.al.; Member for Plasma Etching Device and Method for Manufacturing the Same ; Oct. 17, 2003; EPO; whole document (Year: 2003).*

(Continued)

*Primary Examiner* — Tahseen Khan (74) *Attorney, Agent, or Firm* — Ware, Fressola, Maguire & Barber LLP (57) ABSTRACT

The invention relates to a method for fabricating a plasma etch-resistant film (1) on a surface of a substrate (2), wherein the method comprises the step of forming a film comprising an intermediate layer (4) of rare earth metal oxide, rare earth metal carbonate, or rare earth metal oxycarbonate, or any mixture thereof on a first layer (3) of rare earth metal oxide, wherein the rare earth metal is the same in the first layer and in the intermediate layer. The invention further relates to a plasma etch-resistant film and to the use thereof.

9 Claims, 2 Drawing Sheets

(51) Int. Cl.
*C23C 16/455* (2006.01)
*H01J 37/32* (2006.01)

(58) Field of Classification Search
USPC .......................................................... 428/336
See application file for complete search history.

(56) References Cited

U.S. PATENT DOCUMENTS

| | | |
|---|---|---|
| 2003/0072882 A1 | 4/2003 | Niinisto et al. |
| 2003/0228747 A1* | 12/2003 | Ahn .................. C23C 14/30 438/591 |
| 2004/0043557 A1* | 3/2004 | Haukka ............. H01L 21/02192 438/240 |
| 2004/0191545 A1* | 9/2004 | Han .................. C23C 28/34 428/472 |
| 2005/0051828 A1 | 3/2005 | Park et al. |
| 2006/0244082 A1 | 11/2006 | Ahn et al. |
| 2007/0224451 A1 | 9/2007 | Chandran et al. |
| 2008/0141938 A1 | 6/2008 | Chandran et al. |
| 2012/0052294 A1* | 3/2012 | Poulet ................ C09D 183/04 428/336 |
| 2012/0086104 A1 | 4/2012 | Marsh |
| 2012/0112151 A1 | 5/2012 | Srinivasan et al. |
| 2013/0034708 A1* | 2/2013 | Ryu .................... H01L 21/6715 428/212 |
| 2014/0346650 A1 | 11/2014 | Raisanen et al. |
| 2014/0377504 A1* | 12/2014 | Sun .................... C23C 14/34 428/141 |
| 2018/0044800 A1 | 2/2018 | Hendrix et al. |
| 2018/0073125 A1* | 3/2018 | Sun .................... C23C 14/083 |
| 2018/0087144 A1* | 3/2018 | Sun .................... C23C 14/083 |
| 2018/0209042 A1 | 7/2018 | Wu et al. |
| 2018/0240648 A1 | 8/2018 | Wu et al. |
| 2019/0309413 A1 | 10/2019 | Wu et al. |
| 2019/0338418 A1 | 11/2019 | Goradia et al. |
| 2020/0131632 A1 | 4/2020 | Pavel et al. |

FOREIGN PATENT DOCUMENTS

| | | |
|---|---|---|
| WO | 0231875 A2 | 4/2002 |
| WO | 2014205212 A1 | 12/2014 |

OTHER PUBLICATIONS

Search Report in European Patent Application No. 17759328.2, dated Nov. 4, 2019 (7 pages).
Search Report in Finnish Application No. 20165181, dated Aug. 30, 2016.
Oh, et al., "Hydrophobicity of Rare Earth Oxides Grown by Atomic Layer Deposition", Chemistry of Materials, 27, pp. 148-156, (2015).
Paivasaari, et al., "Atomic Layer Deposition of Rare Earth Oxides", Topics Appl. Physics 106, pp. 15-32, (2007).
Katamreddy, et al., "Atomic layer deposition of rare-earth oxide thin films for high- K dielectric applications", ECS Transactions, 19 (2), pp. 525-536, (2009).
Myllymaki, et al., "Rare earth scandate thin films by atomic layer deposition: effect of the rare earth cation size", Journal of Materials Chemistry, Apr. 14, 2010, 20, pp. 4207-4212.
Wiemer, et al., "Atomic layer deposition of rare-earth-based binary and ternary oxides for microelectronic applications", Semiconductor Science and Technology, Jun. 22, 2012, 27, pp. 1-12.

* cited by examiner

PLASMA ETCH-RESISTANT FILM AND A METHOD FOR ITS FABRICATION

FIELD OF THE INVENTION

The invention relates to a method for fabricating a plasma etch-resistant film on a surface of a substrate. The invention further relates to a plasma etch-resistant film on a surface of a substrate. The invention further relates to the use of a plasma etch-resistant film.

BACKGROUND OF THE INVENTION

The surfaces and components of a plasma reaction chamber are subjected to harsh conditions during the employed process. The resistance to plasmas is thus a desirable property for components used in processing chambers where corrosive environments are present. Therefore, protecting components against such corrosive environment is desired in order to prolong the lifetime of the used components or chambers. To reduce the erosion or degradation of the surfaces exposed to the corrosive environment, thick coatings or films of e.g. aluminium oxide have been formed on the surfaces that are to be protected. The aim of such coatings or films is to act to reduce exposure of the surface to be protected to various plasmas such as $NF_3$, $CF_4$, $CHF_3$, $CH_2F_2$, $C_2F_6$, $SF_6$, $Cl_2$ and HBr. However, although these coatings or films exhibit improved plasma resistance they often have porous structure as a result of e.g. the used fabrication method. Thus, with time, the porous structure allows the adverse effects of the corrosive environment to penetrate through the coating to the surface to be protected and/or to form solid particles that contaminate the surroundings. Also, thick films may easily crack whereby its protective effect is easily lost.

Thus, there remains a need for a method enabling to fabricate a long-lasting plasma etch-resistant film with properties suitable for protecting e.g. the surfaces of a plasma chamber and components thereof against the detrimental processing conditions.

PURPOSE OF THE INVENTION

The purpose of the invention is to provide a new type of method for fabricating a plasma etch-resistant film on a surface of a substrate. Further, the purpose of the invention is to provide a new type of a plasma etch-resistant film and to provide a new use of the plasma etch-resistant film.

SUMMARY

The method according to the present invention is characterized by what is presented in the claims and described herein.

The plasma etch-resistant film according to the present invention is characterized by what is presented in the claims and described herein.

The use according to the present invention is characterized by what is presented in the claims and described herein.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

The present invention relates to a method for fabricating a plasma etch-resistant film on a surface of a substrate, wherein the method comprises the step of forming a film comprising an intermediate layer of rare earth metal oxide, rare earth metal carbonate, or rare earth metal oxycarbonate, or any mixture thereof on a first layer of rare earth metal oxide, wherein the rare earth metal is the same in the first layer and in the intermediate layer, and wherein the step of forming the film comprises, in a reaction space, the steps of:

depositing the first layer by exposing a deposition surface to alternately repeated surface reactions of at least two precursors including a precursor for rare earth metal and a first precursor for oxygen such that the structure of the first layer is crystalline, and depositing the intermediate layer by exposing a deposition surface to alternately repeated surface reactions of at least two precursors including a pre-cursor for rare earth metal and a second precursor for oxygen such that the structure of the intermediate layer is amorphous.

The present invention further relates to a plasma etch-resistant film on a surface of a substrate obtainable by a method according to the present invention.

The present invention further relates to a plasma etch-resistant film on a surface of a substrate, wherein the film comprises an intermediate layer of rare earth metal oxide, rare earth metal carbonate, or rare earth metal oxycarbonate, or any mixture thereof deposited on a first layer of rare earth metal oxide, wherein the rare earth metal is the same in the first layer and in the intermediate layer, and wherein the structure of the first layer is crystalline and the structure of the intermediate layer is amorphous.

The present invention further relates to a plasma etch-resistant film on a surface of a substrate, wherein the film comprises an intermediate layer of rare earth metal oxide, rare earth metal carbonate, or rare earth metal oxycarbonate, or any mixture thereof deposited on a first layer of rare earth metal oxide, wherein the rare earth metal in the intermediate layer is different from the rare earth metal in the first layer, and wherein the structure of the first layer is crystalline and the structure of the intermediate layer is amorphous.

The present invention further relates to a method for fabricating a plasma etch-resistant film on a surface of a substrate, wherein the method comprises the step of forming a film comprising an intermediate layer of rare earth metal oxide, rare earth metal carbonate, or rare earth metal oxycarbonate, or any mixture thereof on a first layer of rare earth metal oxide, wherein the rare earth metal is different in the first layer and in the intermediate layer, and wherein the structure of the first layer is crystalline and the structure of the intermediate layer is amorphous.

The present invention further relates to a plasma etch-resistant film on a surface of a substrate, wherein the film comprises an intermediate layer of aluminium oxide and/or silicon dioxide, deposited on a first layer of rare earth metal oxide, wherein the structure of the first layer is crystalline and the structure of the intermediate layer is amorphous.

The present invention further relates to a method for fabricating a plasma etch-resistant film on a surface of a substrate, wherein the method comprises the step of forming a film comprising an intermediate layer of aluminium oxide and/or silicon dioxide on a first layer of rare earth metal oxide, wherein the structure of the first layer is crystalline and the structure of the intermediate layer is amorphous.

The present invention further relates to the use of the plasma etch-resistant film according to the present invention for protecting a surface of a plasma chamber against the detrimental effects of the processing conditions used in the plasma chamber. The present invention further relates to the use of the plasma etch-resistant film according to the present invention for protecting a surface of a plasma chamber.

The rare earth metal oxide of the first layer is crystalline rare earth metal oxide. The rare earth metal oxide of the intermediate layer is amorphous rare earth metal oxide. The rare earth metal carbonate of the intermediate layer is amorphous rare earth metal carbonate. The rare earth metal oxycarbonate of the intermediate layer is amorphous rare earth metal oxycarbonate. The rare earth metal oxide, the rare earth metal carbonate, or the rare earth metal oxycarbonate of the intermediate layer is amorphous rare earth metal oxide, rare earth metal carbonate, or rare earth metal oxycarbonate.

The first precursor for oxygen is different from the second precursor for oxygen. The inventors of the present invention surprisingly found out that by changing the precursor for oxygen during the process of depositing the plasma etch-resistant film, the structure of the formed layer can be changed in order to enable so-called intermediate layers or cut-off layers to be formed in the film without the need to introduce any layers of different materials in the plasma etch-resistant film. These intermediate layers have the effect of controlling the crystallinity and crystallite phases and hindering the harmful crystalline growth orientation of the following first layer of rare earth metal oxide which results in a final plasma etch-resistant film having a dense or non-porous structure. The dense or non-porous structure has the added utility of hindering propagation of possible cracks. Such a dense or non-porous structure has the technical effect of being able to resist cracking or delamination from the surface of the substrate. I.e. the amorphous intermediate layer formed on a crystalline first layer results in that the growth direction of the crystals in the following first layer will not alter compared to the growth direction of the preceding first layer. Without limiting the present invention to any specific theory, the inventors of the present invention surprisingly found out that the formation of a monoclinic phase of rare earth metal oxide, which may lead to cracking or delamination of the plasma etch-resistant film, can be reduced or avoided by forming one or more intermediate layers of rare earth metal oxide, rare earth metal carbonate, or rare earth metal oxycarbonate, or any mixture thereof with the method according to the present invention.

In one embodiment, the structure of the first layer comprises at least 50 weight-% of the crystalline (222) orientation of the rare earth metal oxide. In one embodiment, the structure of the first layer comprises at least 50 weight-% of the crystalline (440) orientation of the rare earth metal oxide. In one embodiment, the structure of the first layer comprises at least 50 weight-% of a combination of the crystalline (222) orientation and the crystalline (440) orientation of the rare earth metal oxide.

In this specification, unless otherwise stated, the term "the surface", "surface of the substrate", or "deposition surface" is used to address the surface of the substrate or the surface of the already formed layer or deposit on the substrate. Therefore, the terms "surface", "surface of the substrate" and "deposition surface" include the surface of the substrate which has not yet been exposed to any precursors and the surface which has been exposed to one or more precursors. The "deposition surface" thus changes during the deposition process, when chemicals get adsorbed onto the surface.

In one embodiment, the substrate material is selected from a group consisting of aluminum metal, anodized aluminum metal, stainless steel and quartz.

In one embodiment, the substrate material is selected from a group consisting of aluminum metal, stainless steel and quartz pre-coated with aluminium oxide or yttrium oxide formed by any other deposition method than the ALD-type method.

In one embodiment, the first layer and the intermediate layer are fabricated on the deposition surface by an ALD-type process. When the first layer and the intermediate layer are fabricated on the surface of the substrate by an ALD-type process excellent conformality and uniformity is achieved for the passivation layer.

The ALD-type process is a method for depositing uniform and conformal deposits or layers over substrates of various shapes, even over complex three dimensional structures. In the ALD-type process, the substrate is alternately exposed to at least two different precursors (chemicals), usually one precursor at a time, to form on the substrate a deposit or a layer by alternately repeating essentially self-limiting surface reactions between the surface of the substrate (on the later stages, naturally, the surface of the already formed layer on the substrate) and the precursors. As a result, the deposited material is "grown" on the substrate molecule layer by molecule layer.

The distinctive feature of the ALD-type process is that the surface to be deposited is exposed to two or more different precursors in an alternate manner with usually a purging period in between the precursor pulses. During a purging period the deposition surface is exposed to a flow of gas which does not react with the precursors used in the process. This gas, often called the carrier gas is therefore inert towards the precursors used in the process and removes e.g. surplus precursor and by-products resulting from the chemisorption reactions of the previous precursor pulse. This purging can be arranged by different means. The basic requirement of the ALD-type process is that the deposition surface is purged between the introduction of a precursor for a metal and a precursor for a non-metal. The purging period ensures that the gas phase growth is limited and only surfaces exposed to the precursor gas participate in the growth. However, the purging step with an inert gas can, according to one embodiment of the present invention, be omitted in the ALD-type process when applying two process gases, i.e. different precursors, which do not react with each other. Without limiting the present invention to any specific ALD-cycle, it can be mentioned, as an example only, that the purging period can be omitted between two precursors, which do not react with each other. I.e. the purging period can be omitted, in some embodiments of the present invention, e.g. between two different precursors for oxygen if they do not react with each other.

The alternate or sequential exposure of the deposition surface to different precursors can be carried out in different manners. In a batch type process at least one substrate is placed in a reaction space, into which precursor and purge gases are being introduced in a predetermined cycle. Spatial atomic layer deposition is an ALD-type process based on the spatial separation of precursor gases or vapors. The different precursor gases or vapors can be confined in specific process areas or zones while the substrate passes by. In the continuous ALD-type process constant gas flow zones separated in space and a moving substrate are used in order to obtain the time sequential exposure. By moving the substrate through stationary zones, providing precursor exposure and purging areas, in the reaction space, a continuous coating process is achieved enabling roll-to-roll coating of a substrate. In continuous ALD-type process the cycle time depends on the speed of movement of the substrate between the gas flow zones.

Other names besides atomic layer deposition (ALD) have also been employed for these types of processes, where the alternate introduction of or exposure to two or more different precursors lead to the growth of the layer, often through essentially self-limiting surface reactions. These other names or process variants include atomic layer epitaxy (ALE), atomic layer chemical vapour deposition (ALCVD), and corresponding plasma enhanced variants. Unless otherwise stated, also these processes will be collectively addressed as ALD-type processes in this specification.

In one embodiment, the method comprises depositing the intermediate layer on the first layer such that the surface of the first layer is covered by the intermediate layer.

In one embodiment, the deposition surface is exposed to carbon dioxide simultaneously with being exposed to the second precursor for oxygen or after being exposed to the second precursor for oxygen. The presence of the carbon dioxide during the step of depositing the intermediate layer enables or enhances the formation of rare earth metal carbonate or rare earth metal oxycarbonate.

In this specification, unless otherwise stated, the term "rare earth metal oxycarbonate" is used to address any rare earth metal substance which is both an oxide and a carbonate.

In one embodiment, the first precursor for oxygen is selected from a group consisting of water and an alcohol. In one embodiment, the first precursor for oxygen is selected from a group consisting of water, methanol, ethanol, propanol, isopropanol, butanol, 2-butanol, and tert-butanol. In one embodiment, the first precursor for oxygen is water.

In one embodiment, the second precursor for oxygen is selected from a group consisting of ozone; a combination of ozone and water; a combination of ozone and oxygen; a combination of ozone and hydrogen peroxide; oxygen-containing radicals; oxygen plasma; carbon dioxide plasma; organic peroxides; organic hydroperoxides; peroxyacids; and singlet oxygen.

In one embodiment, the second precursor for oxygen is ozone. In one embodiment, the second precursor for oxygen is selected from a group consisting of ozone; and a combination comprising ozone.

In one embodiment, the second precursor for oxygen is selected from a group consisting of a combination of ozone and water; a combination of ozone and oxygen; and a combination of ozone and hydrogen peroxide.

In one embodiment, the second precursor for oxygen is selected from a group consisting of oxygen-containing radicals; oxygen plasma; carbon dioxide plasma; organic peroxides; organic hydroperoxides; peroxyacids; and singlet oxygen.

Examples of an oxygen-containing radical are O* and *OH, wherein * denotes an unpaired electron. By organic peroxides are herein meant organic compounds containing the peroxide functional group R'—O—O—R", wherein R' and R" each independently denote moieties, e.g. hydrocarbon moieties. By organic hydroperoxides are herein meant the organic compounds containing the functional group R—O—O—H, wherein R denotes a moiety, e.g. a hydrocarbon moiety. By peroxyacids is herein meant the compounds containing the functional group R(CO)OOH, wherein R denotes a moiety, e.g. a hydrocarbon moiety. By singlet oxygen is herein meant the electronically excited state of molecular oxygen ($O_2(a^1\Delta_g)$). The use of the above precursors as the second precursor for oxygen has the added utility of enabling the formation of an intermediate layer, which has an amorphous structure.

In one embodiment, the precursor for rare earth metal is selected from a group consisting of a precursor for scandium, a precursor for yttrium, a precursor for lanthanum, a precursor for cerium, a precursor for praseodymium, a precursor for neodymium, a precursor for samarium, a precursor for europium, a precursor for gadolinium, a precursor for terbium, a precursor for dysprosium, a precursor for holmium, a precursor for erbium, a precursor for thulium, a precursor for ytterbium, and a precursor for lutetium. In one embodiment, the precursor for rare earth metal is a precursor for yttrium.

In one embodiment, the precursor for rare earth metal is selected from a group consisting of vaporizable water-reactive compounds of rare earth metals. In one embodiment, the precursor for rare earth metal is selected from a group consisting of vaporizable substituted or unsubstituted partially unsaturated carbocyclic compounds of rare earth metals. In one embodiment, the precursor for rare earth metal is selected from a group consisting of substituted or unsubstituted cyclopentadienyl compounds of rare earth metals. In one embodiment, the precursor for rare earth metal is selected from a group consisting of substituted or unsubstituted cycloheptatrienyl compounds of rare earth metals. In one embodiment, the precursor for rare earth metal is selected from a group consisting of substituted or unsubstituted cyclooctadienyl compounds of rare earth metals. In one embodiment, the precursor for rare earth metal contains at least one ligand selected from a group consisting of substituted or unsubstituted cyclopentadienyl, cycloheptadienyl, and cyclooctadienyl. In one embodiment, the precursor for rare earth metal is preferably a cyclopentadienyl or substituted cyclopentadienyl compound of yttrium, and more preferably tris(methylcyclopentadienyl)yttrium.

In one embodiment, the steps of depositing the first layer and depositing the intermediate layer are carried out by using the same precursor for rare earth metal, or the steps of depositing the first layer and depositing the intermediate layer are carried out by using different precursors for rare earth metal.

In one embodiment, the rare earth metal is selected from a group consisting of scandium, yttrium, lanthanum, cerium, praseodymium, neodymium, samarium, europium, gadolinium, terbium, dysprosium, holmium, erbium, thulium, ytterbium, and lutetium.

In one embodiment, the rare earth metal is yttrium.

In one embodiment, the rare earth metal oxide of the first layer and of the intermediate layer is selected from a group consisting of $Sc_2O_3$, $Y_2O_3$, $La_2O_3$, $CeO_2$, $Ce_2O_3$, $PrO_2$, $Pr_2O_3$, $Nd_2O_3$, $NdO$, $Sm_2O_3$, $SmO$, $Eu_2O_3$, $EuO$, $Eu_3O_4$, $Gd_2O_3$, $TbO_2$, $Tb_2O_3$, $Dy_2O_3$, $Ho_2O_3$, $Er_2O_3$, $Tm_2O_3$, $Yb_2O_3$, $YbO$, $Lu_2O_3$, and any combination thereof.

In one embodiment, the rare earth metal carbonate of the intermediate layer contains at least one inorganic carbonate group $CO_3$.

In one embodiment, the rare earth metal carbonate of the intermediate layer is selected from a group consisting of $Sc_2(CO_3)_3$, $Y_2(CO_3)_3$, $La_2(CO_3)_3$, $Ce_2(CO_3)_3$, $Pr_2(CO_3)_3$, $Nd_2(CO_3)_3$, $Sm_2(CO_3)_3$, $Eu_2(CO_3)_3$, $Gd_2(CO_3)_3$, $Tb_2(CO_3)_3$, $Dy_2(CO_3)_3$, $Ho_2(CO_3)_3$, $Er_2(CO_3)_3$, $Tm_2(CO_3)_3$, $Yb_2(CO_3)_3$, $Lu_2(CO_3)_3$, and any combination thereof.

In one embodiment, the rare earth metal oxycarbonate of the intermediate layer is selected from a group consisting of $Sc_2O_2CO_3$, $Sc_2O(CO_3)_2$, $Y_2O_2CO_3$, $Y_2O(CO_3)_2$, $La_2O_2CO_3$, $La_2O(CO_3)_2$, $Ce_2O(CO_3)_2$, $Ce_2O_2CO_3$, $CeOCO_3$, $Pr_2O_2CO_3$, $Pr_2O(CO_3)_2$, $Nd_2O_2CO_3$, $Nd_2O(CO_3)_2$, $Sm_2O_2CO_3$, $Sm_2O(CO_3)_2$, $Eu_2O_2CO_3$, $Eu_2O(CO_3)_2$, $Gd_2O_2CO_3$, $Gd_2O(CO_3)_2$, $Tb_2O_2CO_3$, $Tb_2O(CO_3)_2$, $Dy_2O_2CO_3$, $Dy_2O(CO_3)_2$, $Ho_2O_2CO_3$, $Ho_2O(CO_3)_2$, $Er_2O_2CO_3$, $Er_2O(CO_3)_2$, $Tm_2O_2CO_3$, $Tm_2O(CO_3)_2$, $Yb_2O_2CO_3$, $Yb_2O_2O(CO_3)_2$, $Lu_2O_2CO_3$, $Lu_2O(CO_3)_2$, and any combination thereof.

In one embodiment, the steps of depositing the first layer and depositing the intermediate layer are carried out in the same temperature or temperature range. In one embodiment, the step of depositing the first layer is carried out at a temperature of 150-450° C., or of 150-350° C., or of 150-250° C., or of 200-250° C., or of 200-230° C. In one embodiment, the step of depositing the intermediate layer are carried out at a temperature of 150-450° C., or of 150-350° C., or of 150-250° C., or of 200-250° C., or of 200-230° C. In one embodiment, the steps of depositing the first layer and of depositing the intermediate layer are carried out at a temperature of 150-450° C., or of 150-350° C., or of 150-250° C., or of 200-250° C., or of 200-230° C. The inventors of the present invention surprisingly found out that the use of the above deposition temperatures minimizes the growth of harmful phases or orientation of the grown material or layer.

The thickness of the material or layer produced by the ALD-type process can be increased by repeating several times a pulsing sequence comprising the aforementioned pulses containing the precursor material, and the purging periods. The number of how many times this sequence, called the "ALD cycle", is repeated depends on the targeted thickness of the layer. In one embodiment, the step of depositing the first layer is carried out until the thickness of the first layer is 10-1000 nm, or 50-500 nm, or 100-300 nm. In one embodiment, the thickness of the first layer is 10-1000 nm, or 50-500 nm, or 100-300 nm. In one embodiment, the step of depositing the intermediate layer is carried out until the thickness of the intermediate layer is 0, 1-50 nm, or 0, 5-10 nm, or 1-5 nm. In one embodiment, the thickness of the intermediate layer is 0, 1-50 nm, or 0, 5-10 nm, or 1-5 nm. In one embodiment, the steps of depositing the first layer and depositing the intermediate layer are repeated until the thickness of the film is at least 0, 5 μm, or at least 2 μm, or at least 5 μm, or at least 10 μm. In one embodiment, the thickness of the film is at least 0, 5 μm, or at least 2 μm, or at least 5 μm, or at least 10 μm.

In one embodiment, the method comprises depositing two or more intermediate layers. In one embodiment, the plasma etch-resistant film comprises two or more intermediate layers. In one embodiment, the plasma etch-resistant film comprises at least two intermediate layers with a distance of 10-1000 nm, or 50-500 nm, or 100-300 nm, in between.

In one embodiment, the method comprises depositing a predetermined number of first layers and a predetermined number of intermediate layers one upon the other in turns. In one embodiment, the method comprises depositing the intermediate layer on the first layer. In one embodiment, the method comprises forming a first layer on the intermediate layer. In one embodiment, the method comprises depositing a first layer on the intermediate layer. In one embodiment, the method comprises depositing the intermediate layer directly on the first layer. In one embodiment, the method comprises forming a first layer directly on the intermediate layer. In one embodiment, the method comprises depositing a first layer directly on the intermediate layer.

The embodiments of the invention described hereinbefore may be used in any combination with each other. Several of the embodiments may be combined together to form a further embodiment of the invention. A method, a film or a use, to which the invention is related, may comprise at least one of the embodiments of the invention described hereinbefore.

An advantage of the method according to the present invention is that a plasma etch-resistant film having a dense or an essentially non-porous structure can be formed. As the formed film has a dense structure, its capability to resist the corrosive environment in a plasma chamber for a long period of time is increased.

An advantage of the method according to the present invention is that an intermediate layer or a cut-off layer can be formed while keeping the oxide material as such the same as in the first layer, i.e. without the need to introduce any layer of different material into the plasma etch-resistant film.

An advantage of the method according to the present invention is that the use of an ALD-type process enabling the formation of an amorphous intermediate layer or so-called cut-off layer allows the fabrication of thick plasma etch-resistant film which does not crack or delaminate from the surface of the substrate.

An advantage of the method according to the present invention is that the use of the ALD-type process enables a controlled and reliable method for producing the plasma etch-resistant film in a one-step process by simply changing the precursors for oxygen from one to another during the deposition process.

EXAMPLES

Reference will now be made in detail to the embodiments of the present invention, an example of which is illustrated in the accompanying drawing.

The description below discloses some embodiments of the invention in such a detail that a person skilled in the art is able to utilize the invention based on the disclosure. Not all steps of the embodiments are discussed in detail, as many of the steps will be obvious for the person skilled in the art based on this specification.

For reasons of simplicity, item numbers will be maintained in the following exemplary embodiments in the case of repeating components.

As presented above the ALD-type process is a method for depositing uniform and conformal films or layers over substrates of various shapes. Further, as presented above in ALD-type processes the layer or film is grown by alternately repeating, essentially self-limiting, surface reactions between a precursor and a surface to be coated. The prior art discloses many different apparatuses suitable for carrying out an ALD-type process. The construction of a processing tool suitable for carrying out the methods in the following embodiments will be obvious to the skilled person in light of this disclosure. The tool can be e.g.

a conventional ALD tool suitable for handling the process chemicals. Many of the steps related to handling such tools, such as delivering a substrate into the reaction space, pumping the reaction space down to a low pressure, or adjusting gas flows in the tool if the process is done at atmospheric pressure, heating the substrates and the reaction space etc., will be obvious to the skilled person. Also, many other known operations or features are not described here in detail nor mentioned, in order to emphasize relevant aspects of the various embodiments of the invention.

Figure 1:
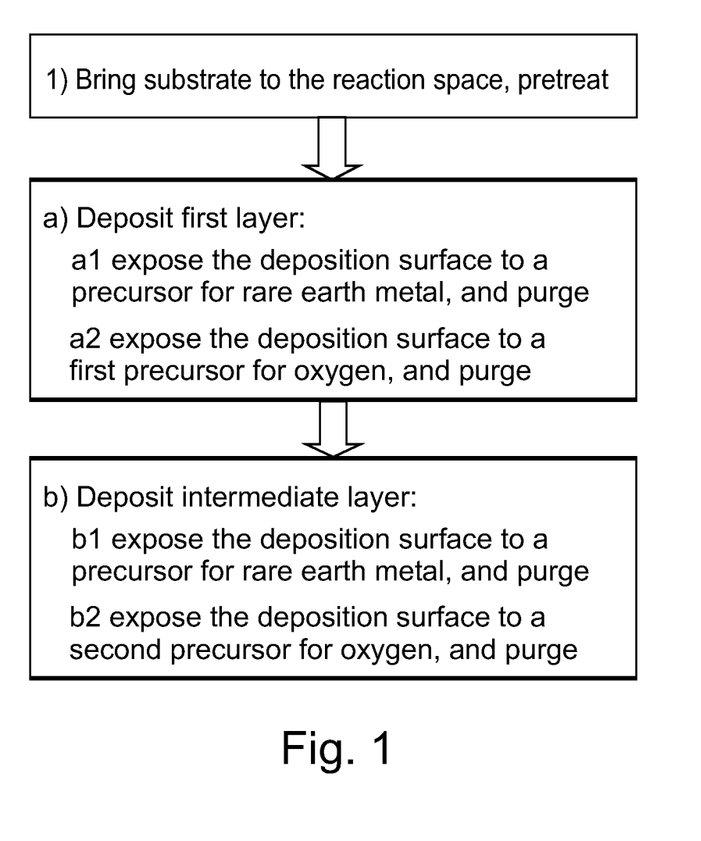
FIG. 1 a flow-chart illustration of a method according to one embodiment of the present invention.
Figure 2:
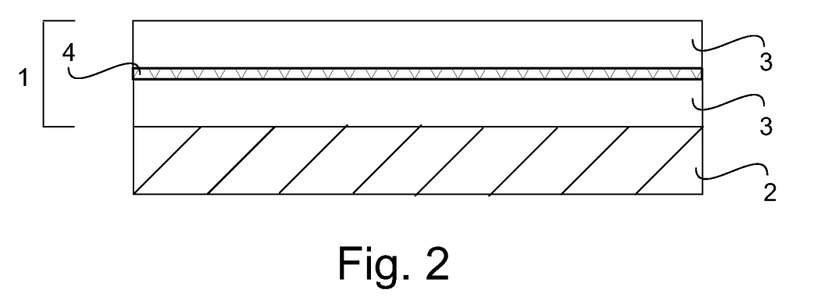
FIG. 2 is a schematic illustration of a plasma etch-resistant film on a substrate according to one embodiment of the present invention.

The method of FIG. 1 and the structure of FIG. 2 illustrate, respectively, a method and the corresponding structure according to one embodiment of the invention. The method of FIG. 1 presents how to carry out the method for fabricating a plasma etchresistant film 1 on the surface of a substrate 2 according to one embodiment of the present invention. This exemplary embodiment of the present invention begins by bringing the substrate 2 into the reaction space (step 1) of a typical reactor tool, e.g. a tool suitable for carrying out an ALD-type process as a batch-type process. The reaction space is subsequently pumped down to a pressure suitable for forming a plasma etch-resistant film 1, using e.g. a mechanical vacuum pump, or in the case of atmospheric pressure ALD systems and/or processes, flows are typically set to protect the deposition zone from the atmosphere. The substrate 2 is also heated to a temperature suitable for forming the film 1 by the used method. The substrate 2 can be introduced to the reaction space through e.g. an airtight load-lock system or simply through a loading hatch. The substrate 2 can be heated in situ by e.g. resistive heating elements which also heat the entire reaction space or ex situ.

After the substrate 2 and the reaction space have reached the targeted temperature and other conditions suitable for deposition, the surface of the substrate can be conditioned in step 1 such that the different layers 3, 4 may be essentially directly deposited on the surface. This conditioning of the surface commonly includes chemical purification of the surface of the substrate 2 from impurities and/or oxidation. Also a conditioning thin film, such as a thin film of $Al_2O_3$ grown by ALD, may be formed on its surface to form a part of the substrate. The conditioning thin film may denote a material that covers any variation in the chemicals composition or crystallinity on the surface of the substrate, prevents possible diffusion of harmful impurity ions from the substrate to a subsequent coating, improves the adhesion of a subsequent coating on its surface and/or makes the surface more suitable for uniform ALD thin film growth. Especially removal of oxide is beneficial when the surface has been imported into the reaction space via an oxidizing environment, e.g. when transporting the exposed silicon surface from one deposition tool to another. The details of the process for removing impurities and/or oxide from the surface of the silicon substrate will be obvious to the skilled person in view of this specification. In some embodiments of the invention the conditioning can be done ex-situ, i.e. outside the tool suitable for ALD-type processes. An example of an ex-situ conditioning process is etching for 1 min in a 1% HF solution followed by rinsing in DI-water. Another example of an ex-situ conditioning process is exposing the substrate to ozone gas or oxygen plasma to remove organic impurities from the substrate surface in the form of volatile gases.

After the surface of the substrate 2 has been conditioned, an alternate exposure of the deposition surface to different chemicals is started, to form a plasma etch-resistant film 1 directly on the surface of the substrate 2.

The precursors are suitably introduced into the reaction space in their gaseous form. This can be realized by first evaporating the precursors in their respective source containers which may or may not be heated depending on the properties of the precursor chemical itself. The evaporated precursor can be delivered into the reaction space by e.g. dosing it through the pipework of the reactor tool comprising flow channels for delivering the vaporized precursors into the reaction space. Controlled dosing of vapor into the reaction space can be realized by valves installed in the flow channels or other flow controllers. These valves are commonly called pulsing valves in a system suitable for ALD-type deposition.

Also other mechanisms of bringing the substrate 2 into contact with a chemical inside the reaction space may be conceived. One alternative is to make the surface of the substrate (instead of the vaporized chemical) move inside the reaction space such that the substrate moves through a region occupied by a gaseous chemical.

A reactor suitable for ALD-type deposition comprises a system for introducing carrier gas, such as nitrogen or argon into the reaction space such that the reaction space can be purged from surplus chemical and reaction by-products before introducing the next chemical into the reaction space. This feature together with the controlled dosing of vaporized precursors enables alternately exposing the surface of the substrate to precursors without significant intermixing of different precursors in the reaction space or in other parts of the reactor. In practice the flow of carrier gas is commonly continuous through the reaction space throughout the deposition process and only the various precursors are alternately introduced to the reaction space with the carrier gas. Obviously, purging of the reaction space does not necessarily result in complete elimination of surplus precursors or reaction by-products from the reaction space but residues of these or other materials may always be present.

Following the step of various preparations (step 1 discussed above), in the embodiment of the present invention shown in FIG. 1, step a) is carried out; i.e. the first layer of rare earth metal oxide is deposited on the deposition surface by exposing the deposition surface to alternately repeated surface reactions of a precursor for rare earth metal and a first precursor for oxygen such that the structure of the formed first layer is crystalline. I.e. a layer of rare earth metal oxide is formed on the surface of the substrate. The rare earth metal oxide of the first layer is crystalline rare earth metal oxide. The first layer 3 can be deposited by exposing, in step a1, the surface of the substrate 2 to a precursor for rare earth metal, such as $(MeCp)_3Y$. Exposure of the surface to the precursor for rare earth metal results in the adsorption of a portion of the introduced precursor, e.g. $(MeCp)_3Y$, onto the surface of the substrate. After purging of the reaction space, the deposition surface is exposed to a first precursor for oxygen, such as water. Subsequently, the reaction space is purged again. Some of the first precursor for oxygen in turn gets adsorbed onto the surface, in the above step a2.

The order of exposing the deposition surface to the above precursors may vary and the deposition surface could equally well be firstly exposed to the first precursor for oxygen instead of the above mentioned order of firstly exposing the deposition surface to the precursor for a rare earth metal.

The above cycle of step a1 and step a2 can be repeated until a predetermined thickness of a first layer 3 is formed on the surface of the substrate. Then the process is continued in step b) by depositing an intermediate layer 4, which in this embodiment is an intermediate layer of a mixture of rare earth metal oxide and rare earth metal carbonate containing at least one inorganic carbonate group $CO_3$, on the first layer formed in step a).

The intermediate layer is deposited on the deposition surface by exposing the deposition surface to alternately repeated surface reactions of a precursor for rare earth metal and a second precursor for oxygen such that the structure of the formed intermediate layer 4 is amorphous. I.e. the intermediate layer is formed on the surface of the first layer 3. The intermediate layer 4 can be deposited by exposing, in step b1, the deposition surface i.e. now the surface of the first layer 3, to a precursor for rare earth metal, such as $(MeCp)_3Y$. Exposure of the surface to the precursor for rare earth metal results in the adsorption of a portion of the introduced precursor, e.g. $(MeCp)_3Y$, onto the deposition surface. After purging of the reaction space, the deposition surface is exposed to a second precursor for oxygen, such as ozone. Subsequently, the reaction space is purged again. Some of the second precursor for oxygen in turn gets adsorbed onto the surface, in the above step b2.

The order of exposing the deposition surface to the above precursors may vary and the deposition surface could equally well be firstly exposed to the second precursor for oxygen instead of the above mentioned order of firstly exposing the deposition surface to the precursor for a rare earth metal.

The above cycle of step b1 and step b2 can be repeated until a predetermined thickness of the intermediate layer 4 is formed on the deposition surface.

Each exposure of the deposition surface to a precursor in step a) or step b), according to the embodiment of FIG. 1, results in formation of additional deposit on the deposition surface as a result of adsorption reactions of the corresponding precursor with the deposition surface. Thickness of the plasma etchresistant film 1 on the surface of the substrate 2 can be increased by repeating step a) and/or step b) one or more times. The thickness of the film is increased until a targeted thickness is reached, after which the alternate exposures are stopped and the process is ended. As a result of the deposition process a plasma etch-resistant film is formed on the surface of the substrate having distinct layers with different structures. The plasma etch-resistant film also has excellent thickness uniformity and compositional uniformity along the deposition surface.

The following example describes how a plasma etch resistant film can be fabricated on a surface of a substrate.

Example 1—Fabricating a Plasma Etch-Resistant Film on a Surface of a Substrate

A plasma etch-resistant film was formed on the surface of a substrate according to an embodiment of the present invention shown in FIG. 1.

In this example a piece of metal with machined features including deep holes was used as a substrate. The substrate was placed into the reaction chamber of a TFS200 ALD reactor. The reaction chamber was pumped to vacuum with a mechanical vacuum pump connected to the exhaust line of the reaction chamber. The pressure of the reaction chamber was adjusted to about 1-2 mbar with the vacuum pump and a continuous flow of nitrogen gas that had a purity of at least 99,9999 vol-% (purity≥6.0). The temperature of the reaction chamber was adjusted to the deposition temperature with PID-controlled electrical resistance heaters. The deposition temperature was 220° C. As a conditioning step, the surface of the substrate was first covered with a layer of aluminium oxide having a thickness of 10 nm and referred to as a conditioning thin film, grown at 220° C. from trimethylaluminum (TMA) and water by the ALD-type method. The conditioning thin film thus formed part of the substrate, on the surface of which the plasma etch-resistant film was formed.

In this example tris(methylcyclopentadienyl)yttrium was used as the precursor for yttrium.

Water kept in an external liquid precursor source in controlled fluid communication with the reaction chamber was used as the first precursor for oxygen. Water had sufficiently high vapor pressure at 20° C. to be pulsed without additional nitrogen carrier gas to the reaction chamber.

A combination of ozone and oxygen gas, generated from oxygen gas with a BMT 803N ozone generator, was used as the second precursor for oxygen. The ozone generator was in controlled fluid communication with the reaction chamber.

The tris(methylcyclopentadienyl)yttrium was heated to 134° C. in an external precursor source to generate adequate vapor pressure of the precursor for yttrium. The external yttrium precursor source was in controlled fluid communication with a nitrogen gas source and the reaction chamber. Nitrogen gas introduced from a nitrogen gas source to the yttrium precursor source was used as a carrier gas for the yttrium precursor vapor.

The first pulsing sequence for forming the first layer ($Y_2O_3$ layer) consisted of the following steps: yttrium precursor vapor pulse, a first nitrogen gas purge, water vapor pulse and a second nitrogen gas purge. The mixture of the nitrogen gas and yttrium precursor vapor formed inside the precursor source was pulsed for 2 s to the reaction chamber where the substrate with reactive hydroxyl sites on the surface was exposed to the yttrium precursor vapor that left chemisorbed yttrium precursor species on the substrate surface. After the yttrium precursor vapor pulse, the reaction chamber was purged with nitrogen gas for 5 s. After the first purge step water vapor was pulsed to the reaction chamber for 0.15 s to form a hydroxylated yttrium oxide surface from the yttrium precursor species chemisorbed on the substrate surface. After the water vapor pulse the reaction chamber was purged with nitrogen gas for 7 s to remove surplus precursor and reaction by-products from the reaction chamber. The pulsing sequence was repeated 1550 times to form the first layer having a thickness of about 200 nm.

Next, the intermediate layer was deposited by repeating a second pulsing sequence 16 times, wherein the second pulsing sequence consisted of the following steps: yttrium precursor vapor (tris(methylcyclopentadienyl)yttrium vapor) pulse (2 s), a first nitrogen gas purge (5 s), oxygen/ozone gas pulse (0.5 s) and a second nitrogen gas purge (7 s). The deposited intermediate layer consisted of a mixture of yttrium oxide, yttrium carbonate and yttrium oxycarbonate, in other words the mixture being $Y_2O_x(CO_3)_{3-x}$, wherein x=0-3.

The deposition of the first layer and the intermediate layer was repeated 10 times to form a plasma etch-resistant film having a thickness of about 2,0 μm.

Figure 3:
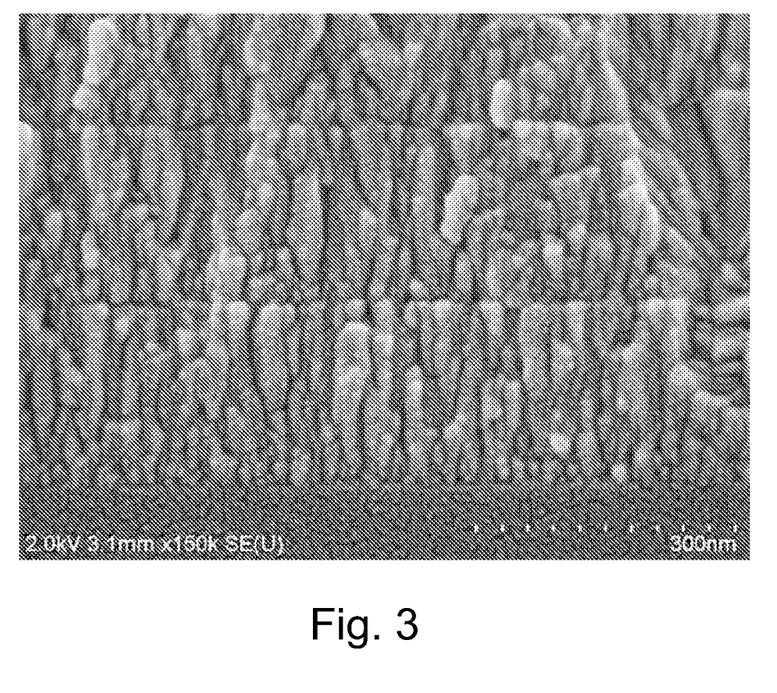
FIG. 3 is a cross sectional field emission scanning electron microscope (FE-SEM) image of a plasma etch-resistant film according to one embodiment of the present invention.

After the deposition process the coated substrate was cooled to room temperature. The plasma etch-resistant film had good adhesion to the substrate. A cross sectional FE-SEM images of FIG. 3 depicted that the plasma etch-resistant film was conformal and covered all external and internal surfaces machined to the substrate. No cracks or pinholes were found in the plasma etch-resistant film.

X-ray diffraction (XRD) patterns revealed that the plasma etch-resistant film consisted of cubic yttrium oxide ($Y_2O_3$) having low fracture propensity (222) and (440) crystal orientations. It was also noticed from the XRD patterns that the intermediate layers had eliminated high fracture propensity monoclinic $Y_2O_3$ phase and cubic (400)-oriented $Y_2O_3$ phase from this plasma etch-resistant film made by the method according to the present invention.

Examples 2-6—Fabricating a Plasma Etch-Resistant Film on a Surface of a Substrate In the above example 1 tris(methylcyclopentadienyl)yttrium was used as the precursor for yttrium, water was used as the first precursor for oxygen, and a combination of ozone and oxygen was used as the second precursor for oxygen. However, as is obvious for the person skilled in the art based on the above specification, also other first precursors for oxygen, other second precursors for oxygen and other precursors for rare earth metal can be used. In the below table 1 examples of forming a plasma etch-resistant film on a surface of a substrate according to some embodiments of the present invention are presented.

TABLE 1

Parameters used for fabricating a plasma etch-resistant film on a surface of a substrate

| | Precursor for rare earth metal | First precursor for oxygen | Second precursor for oxygen | Deposition temperature | Material of the intermediate layer |
|---|---|---|---|---|---|
| Example 2 | $Cp_3Y$ | $H_2O$ | $O_3$ | 230° C. | $Y_2O_x(CO_3)_{3-x}$, x = 0-3 |
| Example 3 | $(EtCp)_3Y$ | $H_2O$ | $O_3$ | 240° C. | $Y_2O_x(CO_3)_{3-x}$, x = 0-3 |
| Example 4 | $(MeCp)_3Y$ | $H_2O$ | $CO_2$ plasma | 230° C. | $Y_2O_x(CO_3)_{3-x}$, x = 0-3 |
| Example 5 | $(^iPrCp)_3Y$ | $H_2O$ | $O_3$ | 240° C. | $Y_2O_x(CO_3)_{3-x}$, x = 0-3 |
| Example 6 | $(MeCp)_3Er$ | $H_2O$ | $O_3$ | 240° C. | $ErO_x(CO_3)_{3-x}$, x = 0-3 |
| Example 7 | $Cp_3Sc$ | $H_2O$ | $O_3$ | 230° C. | $ScO_x(CO_3)_{3-x}$, x = 0-3 |

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A plasma etch-resistant film on a surface of a substrate, wherein the film comprises an intermediate layer of rare earth metal carbonate, or rare earth metal oxy-carbonate or any mixture thereof deposited on a first layer of rare earth metal oxide, wherein the rare earth metal is the same in the first layer and in the intermediate layer, and wherein the structure of the first layer is crystalline and the structure of the intermediate layer is amorphous.

2. The film of claim 1, wherein the rare earth metal is selected from a group consisting of scandium, yttrium, lanthanum, cerium, praseodymium. neodymium, samarium europium, gadolinium, terbium, dysprosium, holmium, erbium, thulium, ytterbium, and lutetium.

3. The film of claim 1, wherein the thickness of the first layer is between 10 and 1000 nm.

4. The film of claim 1, wherein the thickness of the intermediate layer is between 0.1 and 50 nm.

5. A method of using the plasma etch-resistant film of claim 1 for protecting a surface of a plasma chamber against the detrimental effects of the processing conditions used in the plasma chamber.

6. The film of claim 1, wherein the thickness of the first layer is between 50 and 500 nm.

7. The film of claim 1, wherein the thickness of the first layer is between 100 and 300 nm.

8. The film of claim 1, wherein the thickness of the intermediate layer is between 0.5 and 10 nm.

9. The film of claim 1, wherein the thickness of the intermediate layer is between 1 and 5 nm.

* * * * *